US009374924B2

(12) United States Patent
Boretti (10) Patent No.: US 9,374,924 B2
(45) Date of Patent: Jun. 21, 2016

(54) DIN RAIL MOUNTED ENCLOSURE ASSEMBLY AND METHOD OF USE

(71) Applicant: SCHNEIDER ELECTRIC BUILDINGS, LLC, Palatine, IL (US)

(72) Inventor: David Boretti, Lawrence, MA (US)

(73) Assignee: SCHNEIDER ELECTRIC BUILDINGS, LLC, Palatine, IL (US)

( * ) Notice: Subject to any disclaimer, the term of this patent is extended or adjusted under 35 U.S.C. 154(b) by 85 days.

(21) Appl. No.: 14/487,608

(22) Filed: Sep. 16, 2014

(65) Prior Publication Data

US 2016/0081215 A1    Mar. 17, 2016

(51) Int. Cl.
*A47B 96/00* (2006.01)
*H05K 7/14* (2006.01)
*H05K 7/18* (2006.01)

(52) U.S. Cl.
CPC .............. *H05K 7/1401* (2013.01); *H05K 7/183* (2013.01)

(58) Field of Classification Search
USPC ................... 248/221.11, 544, 651, 681, 27.1; 200/50.11; 439/532
See application file for complete search history.

(56) References Cited

U.S. PATENT DOCUMENTS

| 4,269,471 | A | * | 5/1981 | Woertz | H01R 9/2691 439/716 |
| 4,921,445 | A | * | 5/1990 | Herbert | H02B 1/052 439/532 |
| 5,192,227 | A | * | 3/1993 | Bales | H01R 9/2608 439/532 |
| 5,704,805 | A | * | 1/1998 | Douty | H01R 9/2608 439/532 |
| 5,842,889 | A | * | 12/1998 | Kollmann | H02B 1/052 439/716 |
| 5,904,592 | A | * | 5/1999 | Baran | H02B 1/052 361/627 |
| 6,252,765 | B1 | * | 6/2001 | Balzaretti | G06F 1/184 361/679.42 |
| 6,293,820 | B1 | * | 9/2001 | Bechaz | H02B 1/052 439/532 |
| 6,425,770 | B1 | * | 7/2002 | Lostoski | H01R 9/26 361/759 |
| 6,563,697 | B1 | * | 5/2003 | Simbeck | H02B 1/052 200/295 |
| 6,840,819 | B2 | * | 1/2005 | Bet | H02B 1/052 439/157 |

(Continued)

FOREIGN PATENT DOCUMENTS

WO    2013102923 A1    7/2013

OTHER PUBLICATIONS

Notification of transmittal of the International Search Report and the Written Opinion of the International Searching Authority from corresponding PCT/US2015/050112 mailed Dec. 21, 2015.

*Primary Examiner* — Monica Millner
(74) *Attorney, Agent, or Firm* — Lando & Anastasi, LLP (57) ABSTRACT

A mounting enclosure assembly configured to mount an electronic component onto a DIN rail. The mounting enclosure assembly includes a mounting bracket having a slot configured to receive the DIN rail therein. The mounting enclosure assembly further includes a locking mechanism configured to selectively engage the DIN rail. The locking mechanism includes a release button and a protrusion positioned proximate the slot and configured to releasably engage a first flange of the DIN rail. The locking mechanism further includes a first hinged armature connected to the release button and the first protrusion, wherein the first protrusion is configured to disengage the first flange of the DIN rail when the release button is depressed. Other embodiments of the mounting enclosure assembly, as well as methods directed to the mounting enclosure assembly, are further disclosed.

18 Claims, 11 Drawing Sheets

(56) References Cited

U.S. PATENT DOCUMENTS

| | | | |
|---|---|---|---|
| 7,017,608 B2 | 3/2006 | Erickson et al. | |
| 7,374,453 B1* | 5/2008 | Allcock | B66C 7/08 |
| | | | 439/532 |
| 7,516,927 B2* | 4/2009 | Portal | H01R 9/2608 |
| | | | 248/221.11 |
| 7,674,129 B1* | 3/2010 | Liu | H02B 1/052 |
| | | | 361/807 |
| 7,704,102 B2* | 4/2010 | Nad | H01R 9/26 |
| | | | 439/221 |
| 7,758,368 B2* | 7/2010 | Schelonka | H01R 9/2608 |
| | | | 439/325 |
| 7,922,521 B1* | 4/2011 | Wu | H01R 9/2691 |
| | | | 439/532 |
| 7,980,891 B2* | 7/2011 | Molnar | H01R 9/2608 |
| | | | 361/735 |
| 8,011,951 B2* | 9/2011 | Moore | H02B 1/052 |
| | | | 439/532 |
| 8,066,239 B2* | 11/2011 | Molnar | H02B 1/052 |
| | | | 248/214 |
| 8,226,433 B1* | 7/2012 | Correll | H01R 9/2608 |
| | | | 439/532 |
| 2005/0175402 A1* | 8/2005 | Schurr | H02B 1/052 |
| | | | 403/331 |
| 2005/0234681 A1 | 10/2005 | Johnson et al. | |
| 2006/0079124 A1* | 4/2006 | Barile | H02B 1/052 |
| | | | 439/532 |
| 2006/0175489 A1 | 8/2006 | Portal | |
| 2007/0133152 A1* | 6/2007 | Karim | H02B 1/042 |
| | | | 361/647 |
| 2008/0108248 A1* | 5/2008 | Lim | H02B 1/052 |
| | | | 439/532 |
| 2008/0166896 A1* | 7/2008 | Choi | H01R 13/639 |
| | | | 439/43 |
| 2009/0129101 A1* | 5/2009 | Bowden, Jr. | F21V 21/02 |
| | | | 362/371 |
| 2009/0286422 A1* | 11/2009 | Henkel | H02B 1/052 |
| | | | 439/532 |
| 2010/0035464 A1* | 2/2010 | Capaldi-Tallon | H01R 9/2608 |
| | | | 439/532 |
| 2010/0203774 A1 | 8/2010 | Lanning et al. | |
| 2010/0232114 A1 | 9/2010 | Jain | |
| 2010/0240326 A1* | 9/2010 | Balcon | H02B 1/044 |
| | | | 455/90.3 |
| 2010/0255713 A1* | 10/2010 | Peng | H02B 1/052 |
| | | | 439/532 |
| 2010/0285690 A1 | 11/2010 | Molnar | |
| 2010/0314522 A1 | 12/2010 | Molnar et al. | |
| 2011/0061591 A1 | 3/2011 | Stecker | |
| 2011/0269339 A1* | 11/2011 | Baran | H05K 7/1474 |
| | | | 439/532 |
| 2011/0273844 A1 | 11/2011 | Rivera Hernandez et al. | |
| 2013/0023150 A1* | 1/2013 | von zur Muehlen | H01H 85/24 |
| | | | 439/532 |
| 2013/0260605 A1* | 10/2013 | Kawabata | H01R 9/2608 |
| | | | 439/532 |
| 2013/0322044 A1* | 12/2013 | Kusumi | H02B 1/0523 |
| | | | 361/807 |
| 2014/0199864 A1* | 7/2014 | Devanand | H01R 9/2608 |
| | | | 439/116 |
| 2014/0226287 A1* | 8/2014 | V | H02B 1/052 |
| | | | 361/747 |
| 2014/0268512 A1* | 9/2014 | Kho | H02B 1/052 |
| | | | 361/679.01 |
| 2014/0357117 A1* | 12/2014 | Deshpande | H02B 1/052 |
| | | | 439/532 |
| 2015/0016875 A1* | 1/2015 | Eminovic | H02B 1/052 |
| | | | 403/322.4 |

* cited by examiner

DIN RAIL MOUNTED ENCLOSURE ASSEMBLY AND METHOD OF USE

BACKGROUND

1. Field of Disclosure

The present disclosure relates generally to the field of electronics and, more particularly, to assemblies and methods for securing and removing electronic components to and from a rail system, such as a DIN rail system.

2. Discussion of Related Art

Figure 1:
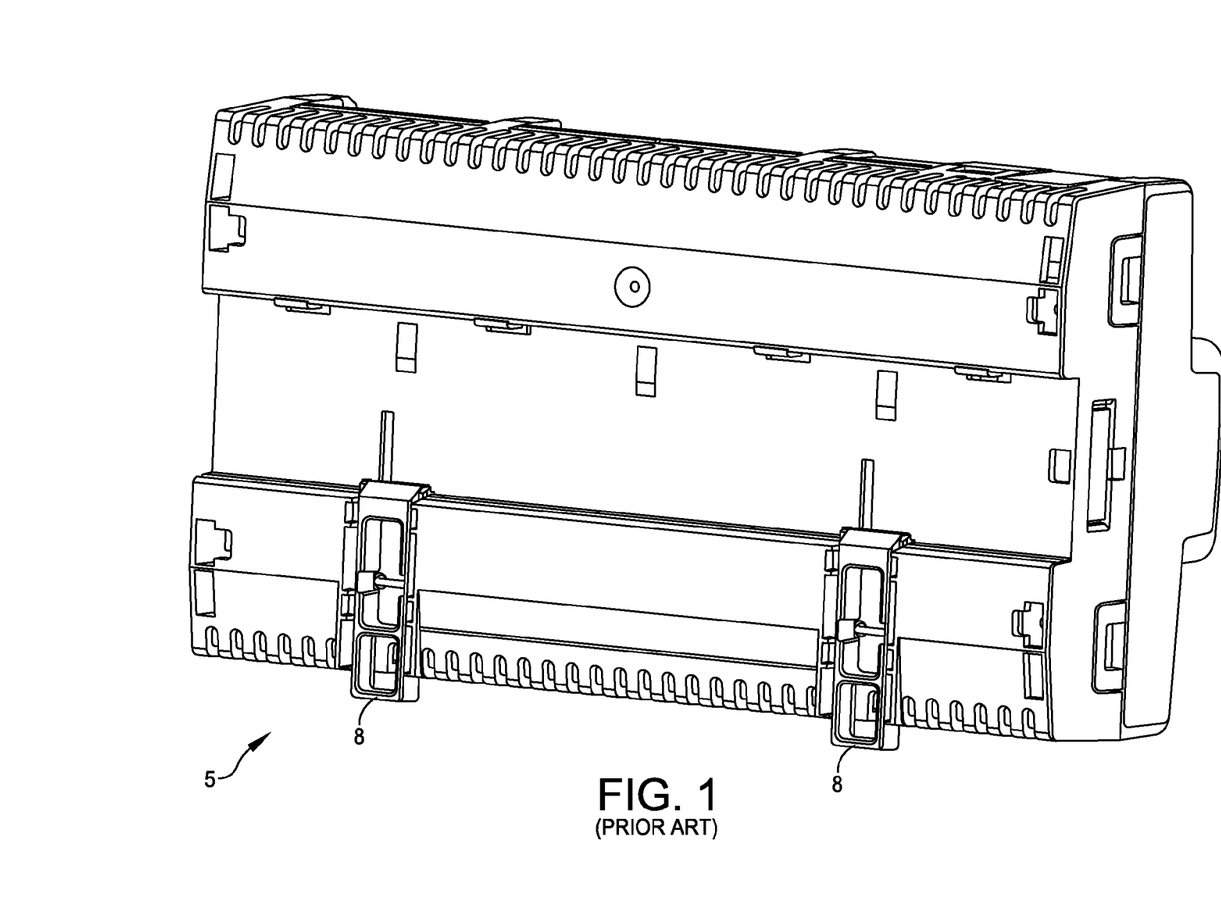
FIG. 1 is a back perspective view of a prior art mounting enclosure assembly having two conventional DIN clips.

Current DIN-mounted devices are designed with a single DIN clip or multiple DIN clips that require a tool and two hands when installing or removing the device from a standard 35 mm DIN rail. Installing or removing these larger devices can be very difficult, particularly for devices that are of a size that requires two or more DIN clips. For example, when trying to remove a larger device one typically needs to push one DIN clip in a downward direction with a tool to disengage the device from the DIN rail. While holding up that portion of the device with one hand to prevent reattachment, one must use their other hand to release the other DIN clip with the tool. Such removal can prove to be very difficult, time consuming, and counter-intuitive for users. FIG. 1 shows an example of a prior art mounting assembly generally indicated at 5 having two conventional DIN clips, each indicated at 8, as described above.

SUMMARY OF DISCLOSURE

One aspect of the present disclosure is directed to a mounting enclosure assembly configured to mount an electronic component onto a DIN rail. In one embodiment, the mounting enclosure assembly includes a mounting bracket including a body having a slot configured to receive the DIN rail therein. The mounting enclosure assembly further includes a locking mechanism connected to the body of the mounting bracket, the locking mechanism being configured to selectively engage the mounting enclosure assembly to the DIN rail. The locking mechanism includes a release button. The locking mechanism further includes a first protrusion positioned proximate the slot and configured to releasably engage a first flange of the DIN rail. The locking mechanism further includes a first hinged armature connected to the release button and the first protrusion. The first protrusion is configured to disengage the first flange of the DIN rail when the release button is depressed.

According to certain embodiments of the mounting enclosure assembly, the locking mechanism further may include a second protrusion spaced apart from the first protrusion, the second protrusion being positioned proximate the slot and configured to selectively engage the first flange of the DIN rail, and a second hinged armature connected to the release button and the second protrusion. The second protrusion is configured to disengage the first flange of the DIN rail when the release button is depressed. According to certain embodiments of the mounting enclosure assembly, the locking mechanism may be substantially symmetrical about a plane extending through a center of the release button.

According to certain embodiments of the mounting enclosure assembly, the first protrusion may have a first beveled edge and the second protrusion may have a second beveled edge. According to certain embodiments of the mounting enclosure assembly, the body of the mounting bracket further may include a third protrusion configured to selectively engage a second flange of the DIN rail, the third protrusion being positioned proximate the slot of the body of the mounting bracket. According to certain embodiments of the mounting enclosure assembly, the body of the mounting bracket further may include a fourth protrusion configured to releasably engage the second flange of the DIN rail, the fourth protrusion being spaced apart from the third protrusion and positioned proximate the slot of the body of the mounting bracket.

According to certain embodiments of the mounting enclosure assembly, the first hinged armature may include a first portion positioned proximate the first protrusion, a second portion positioned proximate the release button, and a hinge positioned between the first portion and the second portion. According to certain embodiments of the mounting enclosure assembly, the first portion of the first hinged armature may include a boss, and the body of the mounting bracket further may include a recess to receive the boss. According to certain embodiments of the mounting enclosure assembly, the first portion of the first hinged armature may be configured to pivot around the boss when the release button is depressed.

According to certain embodiments of the mounting enclosure assembly, the hinge may be integral to the first and second portions of the first hinged armature. According to certain embodiments of the mounting enclosure assembly, the hinge may be formed by a first tapered end of the first portion of the first hinged armature and a second tapered end of the second portion of the first hinged armature.

According to certain embodiments of the mounting enclosure assembly, the first portion of the first hinged armature may be positioned at an angle to the second portion of the first hinged armature. According to certain embodiments of the mounting enclosure assembly, the first portion of the first hinged armature may be positioned substantially perpendicular to the second portion of the first hinged armature. According to certain embodiments of the mounting enclosure assembly, the first portion of the first hinged armature may extend in a direction that is substantially parallel to a direction of the slot, when the mounting enclosure assembly is engaged to the DIN rail.

According to certain embodiments of the mounting enclosure assembly, the locking mechanism further may include an opening configured and positioned to receive a first fastener therein so that when the first fastener is positioned in an opening, the release button cannot be depressed. The body of the mounting bracket further may include at least one eyelet configured to receive a second fastener.

Another aspect of the present disclosure is directed to a method of securing and releasing a mounting enclosure assembly to and from a DIN rail. In one embodiment, the method comprises: providing the mounting enclosure assembly including a locking mechanism having a release button, a first protrusion configured to selectively engage a first flange of the DIN rail, and a first hinged armature connected to the release button and the first protrusion; securing the mounting enclosure assembly to the DIN rail; gripping the mounting enclosure assembly; depressing the release button; lifting the mounting enclosure assembly off of a first flange of the DIN rail while the release button is engaged; and lifting the mounting enclosure assembly off of a second flange of the DIN rail.

According to certain embodiments of the method, gripping the mounting enclosure assembly may include gripping the mounting enclosure assembly with only a single hand. According to certain embodiments of the method, depressing the release button may include manipulating the release button with a thumb of the single hand while gripping the mounting enclosure assembly. According to certain embodiments of the method, the locking mechanism further may include a second protrusion configured to releasably engage a first flange of the DIN rail, and a second hinged armature connected to the release button and the second protrusion.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the disclosure. In the figures:

DETAILED DESCRIPTION

As discussed above, traditional DIN clips suffer from disadvantages related to the effort required to disengage or otherwise release a mounting enclosure assembly from a DIN rail. Accordingly, there is a need for a more efficient DIN clip, also referred to as a locking mechanism.

The systems and methods disclosed herein provide a push-button locking mechanism that achieves the same holding strength as two common DIN clips. The locking mechanism is conducive to one-handed operation and requires no tools. The locking mechanism may be molded from a PC/ABS plastic resin and may be assembled into a plastic base housing during manufacturing.

Basic operation consists of pushing a release button with, for example, a person's thumb, to engage and disengage the assembly from the DIN Rail. When the release button is pushed, a DIN clip protrusion moves away from the DIN rail, thereby disengaging the assembly from the DIN rail and allowing the assembly to be lifted off or on when servicing. Depression of the release button causes an attached hinge to compress and at least a portion of a hinged armature to rotate about a pivot point, which results in the DIN clip protrusion moving away from a flange of the DIN rail, freeing the device from the flange. When the button is released, the stored energy in the compressed hinge reacts like a spring forcing the DIN clip back to a home position securing the assembly to the DIN rail.

As used herein, the DIN rail is a metal rail of a standard type widely used for mounting electronic components, such as circuit breakers, power modules and other types of industrial control equipment inside equipment racks. In one embodiment, the DIN rail can be made from cold rolled carbon steel sheet with a zinc-plated and chromed bright surface finish. The DIN rail also may be fabricated from aluminum, stainless steel, copper, or any other suitable conductive metal or alloy material. The term "DIN" stands for Deutsches Institut für Normung of Germany. The DIN rail has been adopted by European (EN) and international (ISO) standards.

Figure 2:
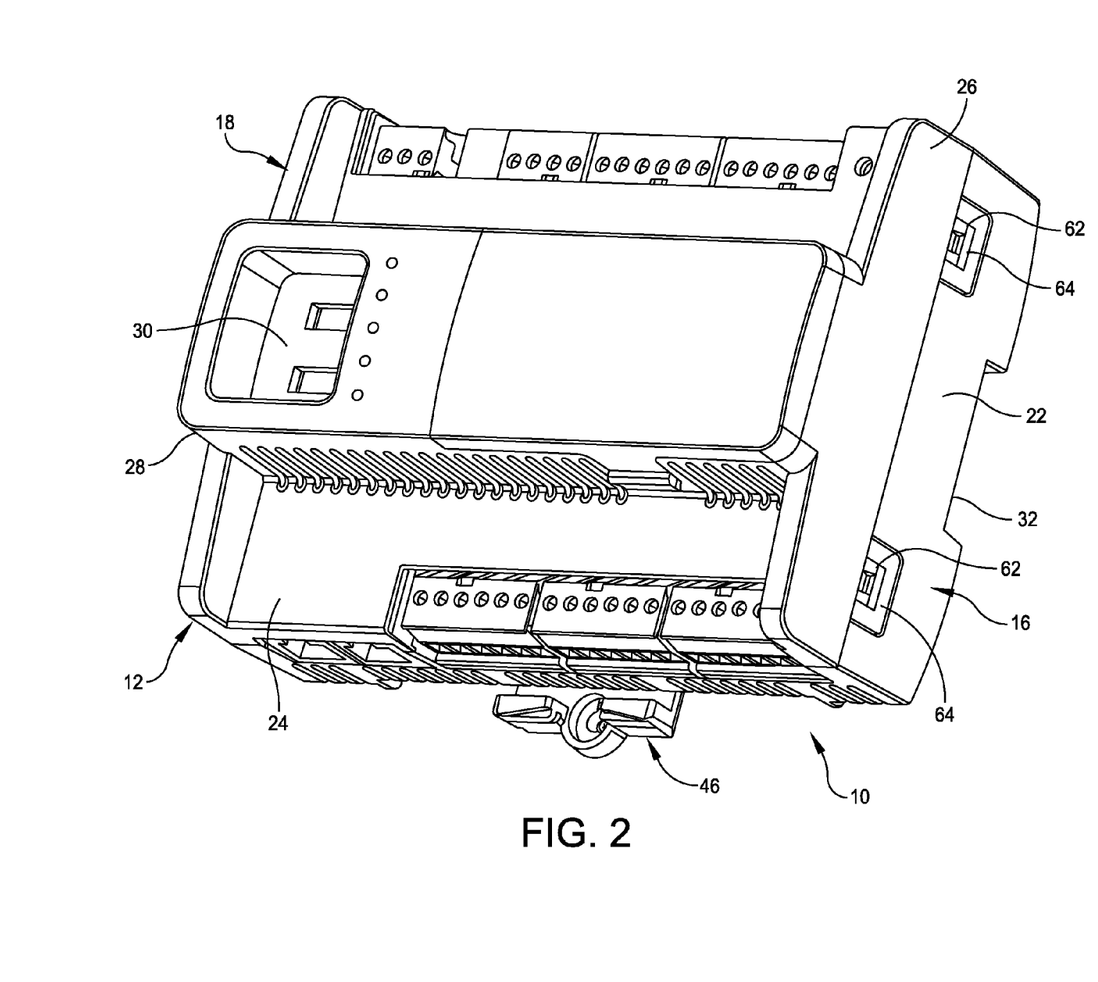
FIG. 2 is a top perspective view of a mounting enclosure assembly.
Figure 3:
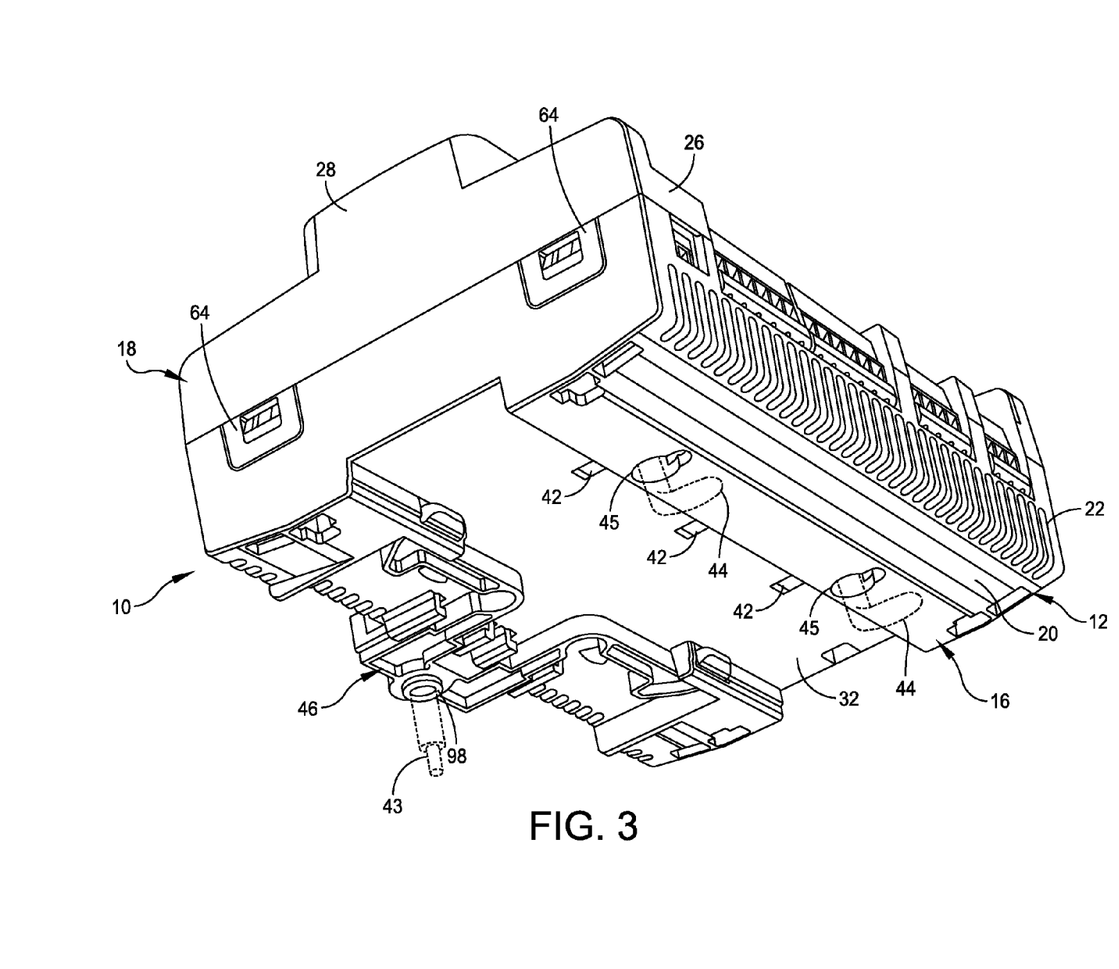
FIG. 3 is a back perspective view of the mounting enclosure assembly having an improved locking mechanism of an embodiment of the present disclosure.

Referring now to the drawings, and more particularly to FIGS. 2 and 3, a mounting enclosure assembly is generally indicated at 10. As shown, the mounting enclosure assembly 10 includes a mounting bracket, generally indicated at 12. The mounting bracket 12 includes a body having a base 16 and a cover 18, which is removably securable to the base 16. As shown, the base 16 and the cover 18 of the mounting bracket 12, when assembled, form a generally box-shaped structure that is designed to house a plurality of printed circuit board assemblies ("PCBAs") within the body. The PCBAs are secured within the body of the mounting bracket 12 according to any number of manners. For example, interior slots may be formed on an inner surface of the mounting bracket 12, and the PCBAs may be secured to these interior slots.

In one embodiment, the base 16 includes a back wall 20 and a contiguous peripheral outer wall 22 that extends from the back wall 20. Similarly, the cover 18 includes a front wall 24 and a contiguous peripheral outer wall 26 that extends from the front wall. The outer wall 22 of the base 16 and the outer wall 26 of the cover 18 engage one another at peripheral edges when assembled to create a unified structure or body. As shown in FIG. 2, the front wall 24 of the cover 18 of the mounting bracket 12 includes a raised portion 28 having a display panel 30, which displays relevant information about the electronic components (e.g., PCBAs) housed within the mounting enclosure assembly 10. As shown in FIG. 3, the back wall 20 of the base 16 of the mounting bracket 12 includes a mounting configuration defined by a recessed slot 32 formed in the base. Although the mounting bracket 12 is shown and described as having the base 16 and the mating cover 18, it should be understood that the mounting bracket 12 can be any size or shaped box or enclosure and still fall within the scope of the present disclosure.

Figure 6:
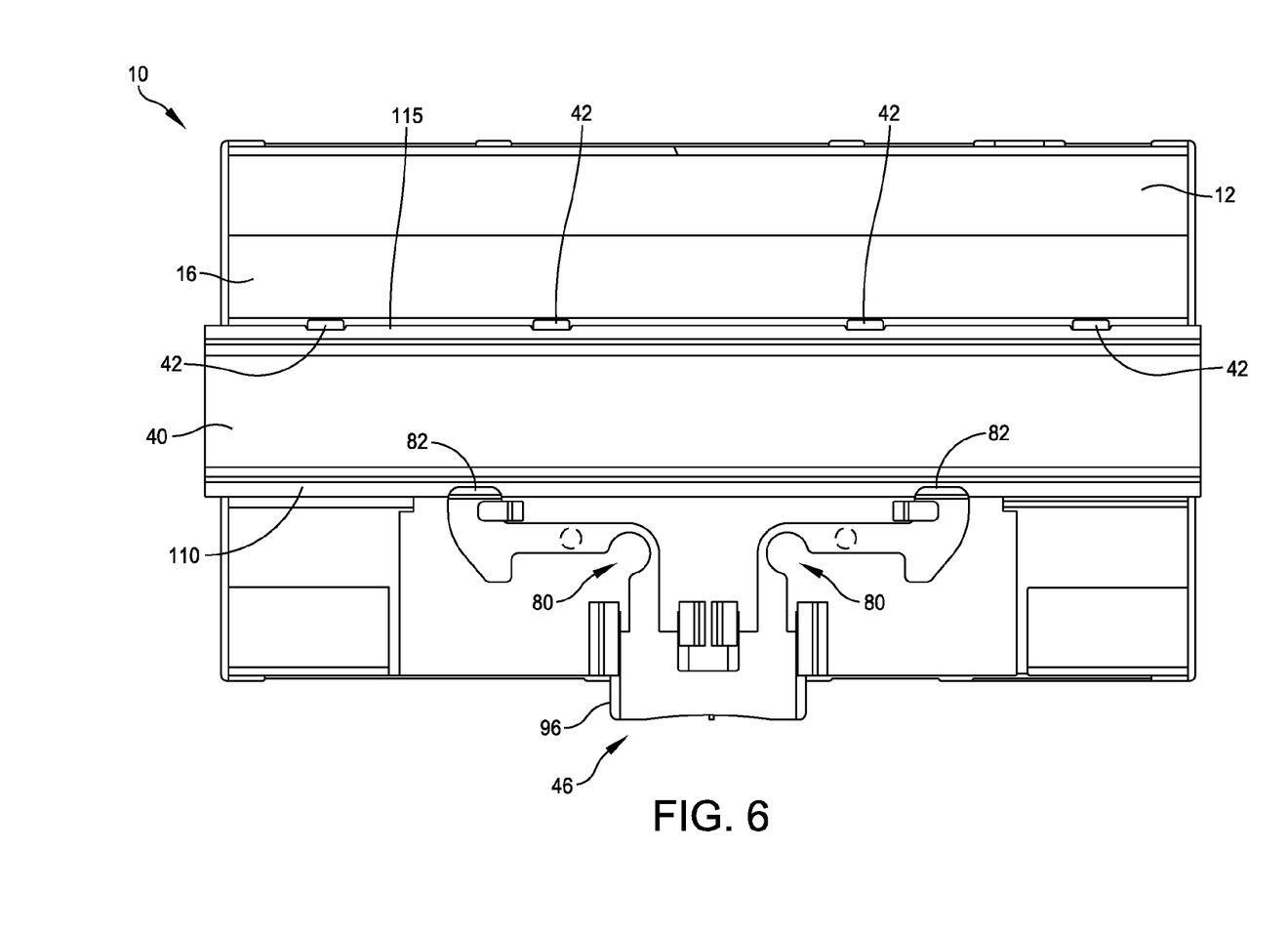
FIG. 6 is a back perspective view of the locking mechanism of the mounting enclosure assembly secured to the DIN rail.

The base 16 of the mounting bracket 12 may be formed with protrusions 42 to aid in securing the base 16 of the mounting bracket 12 to the DIN rail 40, shown in FIG. 6. The back wall 20 of the base 16 of the mounting bracket 12 includes a locking mechanism generally indicated at 46 to releasably lock the mounting enclosure assembly 10 to the DIN rail 40. The construction and operation of the locking mechanism 46 is discussed in detail, below.

The cover 18 is releasably secured to the base 16 by tabs, each indicated at 62, that extend up from the outer wall 22 of the base 16 near the corners of the base. The tabs 62 are received within respective openings, each indicated at 64, formed in the cover 18 near the corners of the cover 18.

Figure 4:
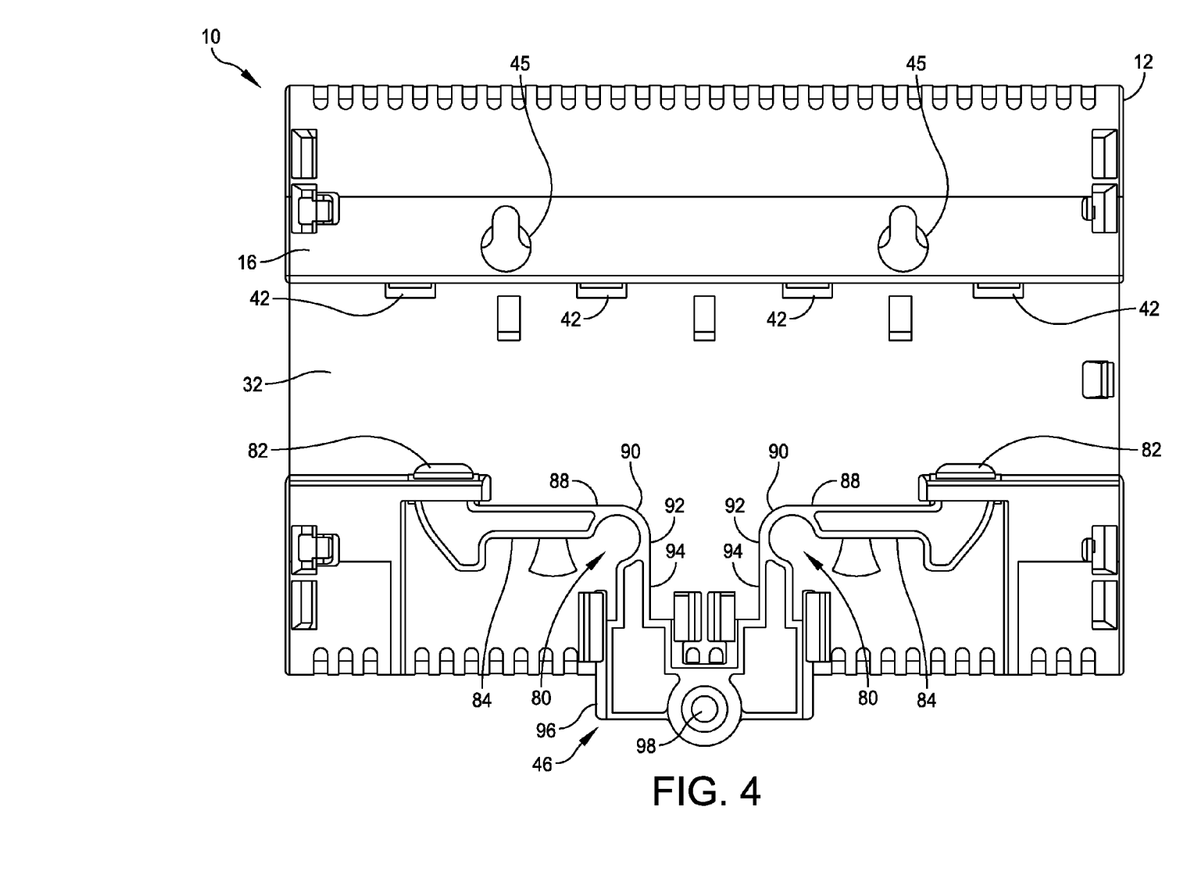
FIG. 4 is a back perspective view of the locking mechanism of the mounting enclosure assembly.
Figure 5:
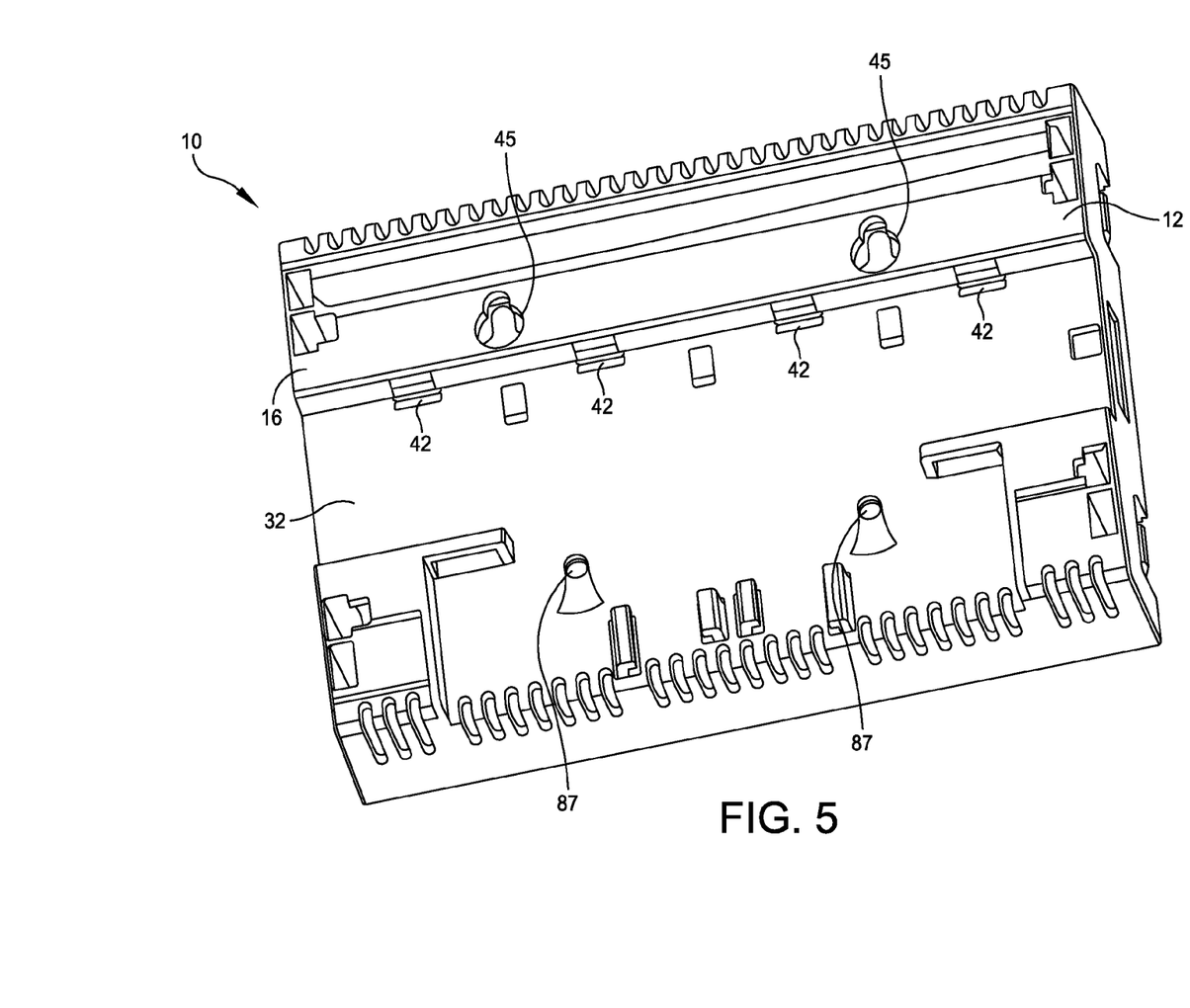
FIG. 5 is a back perspective view of the mounting enclosure assembly with the locking mechanism removed to expose the underlying base.

As shown with additional reference to FIGS. 4-6, the locking mechanism 46 is attached to the base 16 of the mounting enclosure assembly 10. As shown, protrusions 82 of the locking mechanism 46 extend into the slot 32 of the base 16 and are configured for securing the mounting enclosure assembly 10 to the DIN rail 40. In FIG. 6, the protrusions 82 of locking mechanism 46 are designed to engage a first flange 110 of a DIN rail 40 while the fixed set of protrusions 42 positioned on the base 16 of the mounting bracket 12 across slot 32 are positioned to engage a second flange 115 of the DIN rail 40. FIG. 5 illustrates the locking mechanism 46 removed to expose the underlying base 16. Each recess 87 is positioned to receive a corresponding boss 86 (shown in FIG. 7) from the locking mechanism 46.

Figure 7:
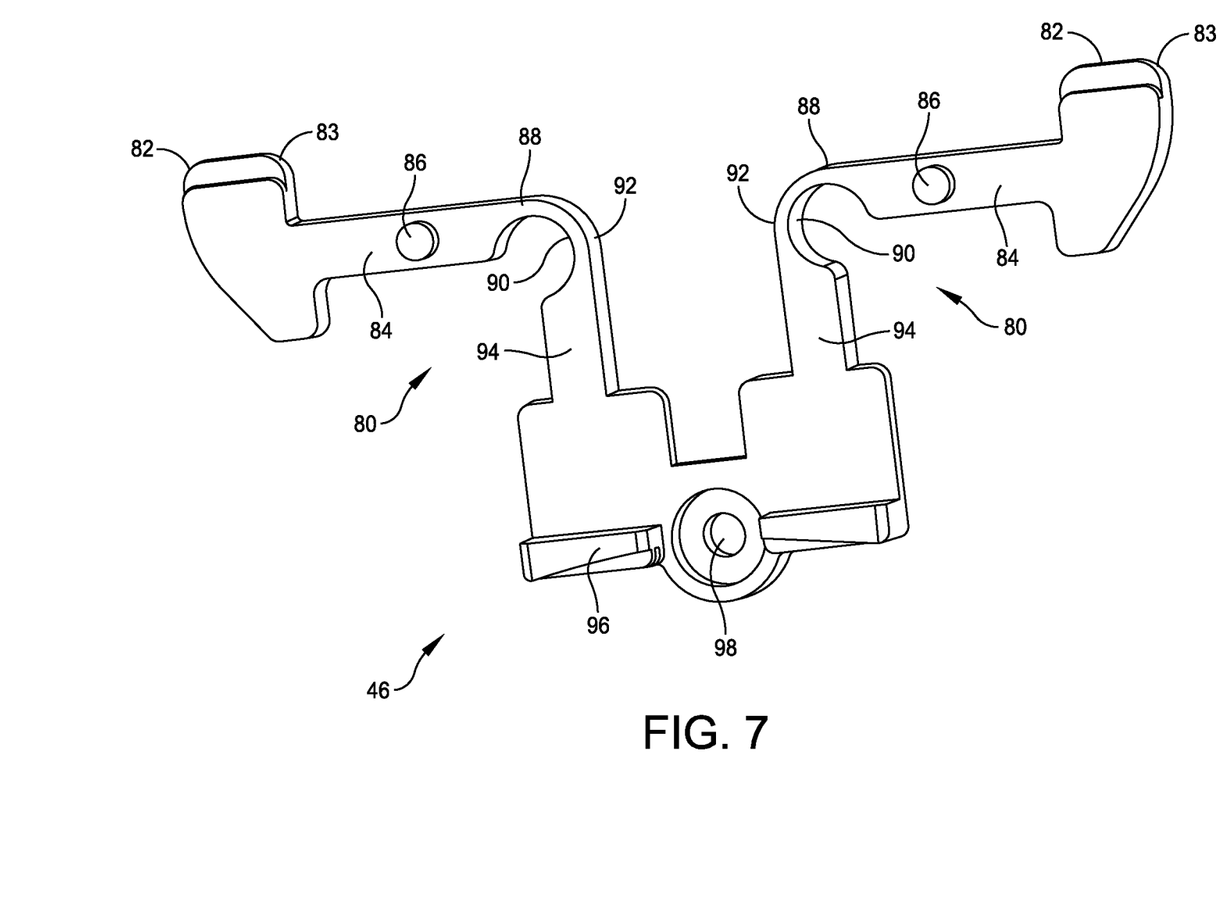
FIG. 7 is a front perspective view of the locking mechanism.
Figure 8:
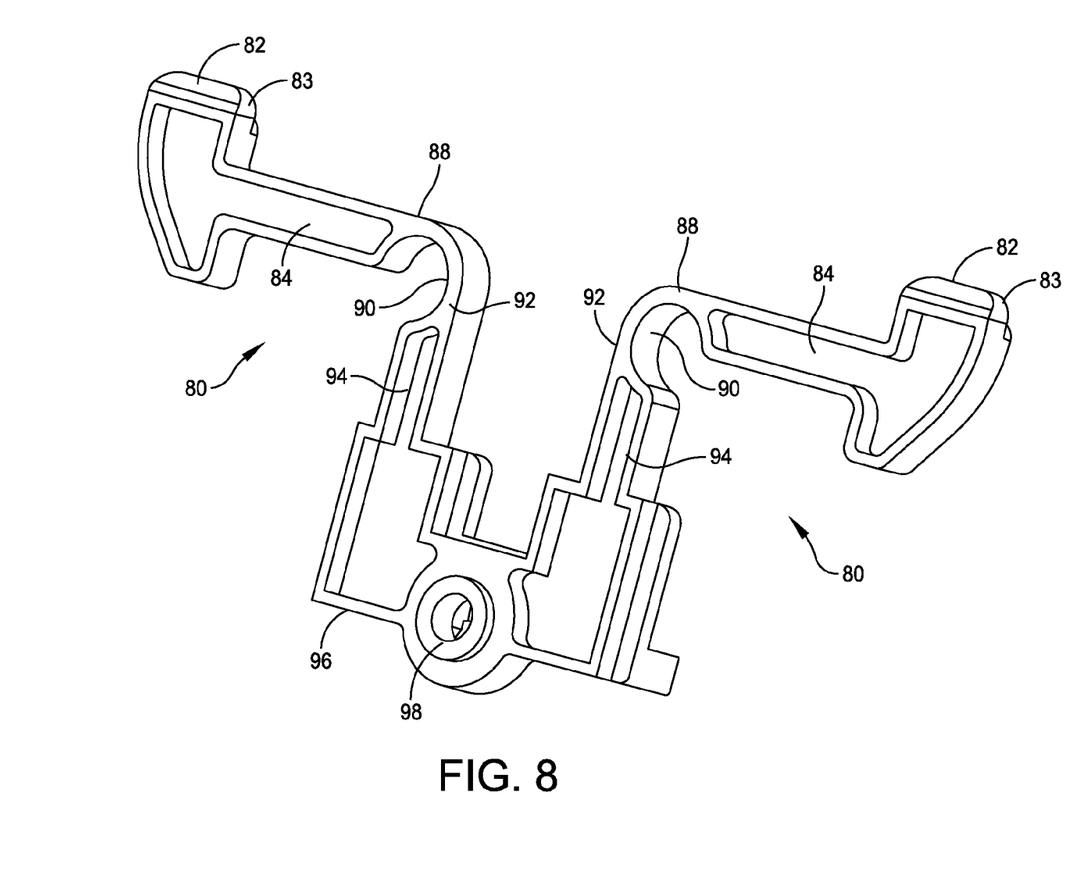
FIG. 8 is a back perspective view of the locking mechanism.

FIGS. 7 and 8 show the locking mechanism 46 isolated from the mounting enclosure assembly 10. The locking mechanism 46 includes a release button 96. The release button 96 is connected to the protrusion 82 by an armature 80. In one embodiment, the armature 80 is a hinged armature. The armature 80 is configured to translate a force of depressing the button 96 into a rotational movement of the protrusion 82 away from the DIN-rail flange 110. The hinged armature 80 includes a hinge 90 situated between a first portion 84 proximate the protrusion 82 and a second portion 94 proximate the release button 96. The hinge 90 functions elastically to return the mechanism 46 to a secure position when the button 96 is released. Tapered ends 88, 92 of the respective portions 84, 94 of the hinged armature 80 form the hinge 90. The first portion 84 is positioned at an angle to the second portion 94. For example, the first portion 84 is positioned substantially perpendicularly to the second portion 94, as shown.

The locking mechanism 46 includes the second protrusion 82 to aid further in securing the assembly 10 to the DIN rail 40, particularly in a larger assembly, such as assembly 10. According to some embodiments, the second protrusion 82 is attached to the release 96 button by a second hinged armature 80. The second hinged armature 80 may be a mirror image of the first armature 80. For example, the locking mechanism 46 may be substantially symmetrical about an imaginary plane extending through the center of the release button 96.

As shown in FIGS. 7 and 8, the protrusions 82 are beveled. The beveled edge 83 of the protrusions 82 aid in engaging the flange 110 of the DIN rail 40. The beveled edge 83 causes the protrusion 82 to retract when it contacts the flange 110. Then after passing the flange 110, the protrusion 82 snaps back and locks into place. The beveled edge 83 may allow the protrusion to engage the flange 110, without the operator having to first depress a release button 96. However, once the locking mechanism 46 is engaged to the flange 110, the beveled edge 83 does not compromise the secure engagement.

The release button 96 further includes an opening 98 to receive a fastener therein. The fastener may be, for example, a screw, nail, tack, bolt or any similar element that functions to block depression of the release button. The fastener fastens to another surface after passing through the opening in the release button 96. The surface may be, for example, a wall, a floor, or a table surface. Referring to FIG. 3, this figure shows an optional fastener 43 extending through the opening 98 in the locking mechanism 46 to aid in securing the assembly 10 to the surface. In some embodiments the fastener 43 may operate in conjunction with optional fasteners 44 which are secured to eyelets 45 on the base 16 of the mounting bracket 12, the eyelets 45 functioning as anchoring points. In such an embodiment, the assembly 10 may be attached to the surface at three points.

The first portion 84 of the locking mechanism 46 further includes a boss 86 designed to mate with a recess 87 in the body of the mounting bracket 12. FIG. 5 shows a non-limiting example of such a recess 87 in the base 16 portion of the body. In operation, this mated coupling between the boss 86 and the recess 87 functions as a pivot point for the locking mechanism 46. Depression of the release button 96 causes the hinged armature 80 to rotate about the pivot point causing the hinge 90 to compress. This action results in the DIN clip protrusion 82 moving away from the DIN rail flange 110, thereby freeing the assembly 10. When the release button 96 is released, the stored energy in the compressed hinge 90 reacts like a spring, forcing the locking mechanism 46 back to the home position to secure the base 16 of the assembly 10 to the DIN rail 40.

FIG. 6 shows the assembly 10 with the improved locking mechanism 46 engaged to the DIN rail 40. In this embodiment, the pair of protrusions 82 from the locking mechanism 46 engages the first flange 110 of the DIN rail 40. Meanwhile, the second set of protrusions 42 extending from the base 16 of the body of the mounting bracket 12 engage the second flange 115 of the DIN rail 40. In such a manner, the assembly 10 is secured to the DIN rail 40 until an operator manipulates the locking mechanism 46 to remove the assembly 10.

Figure 9:
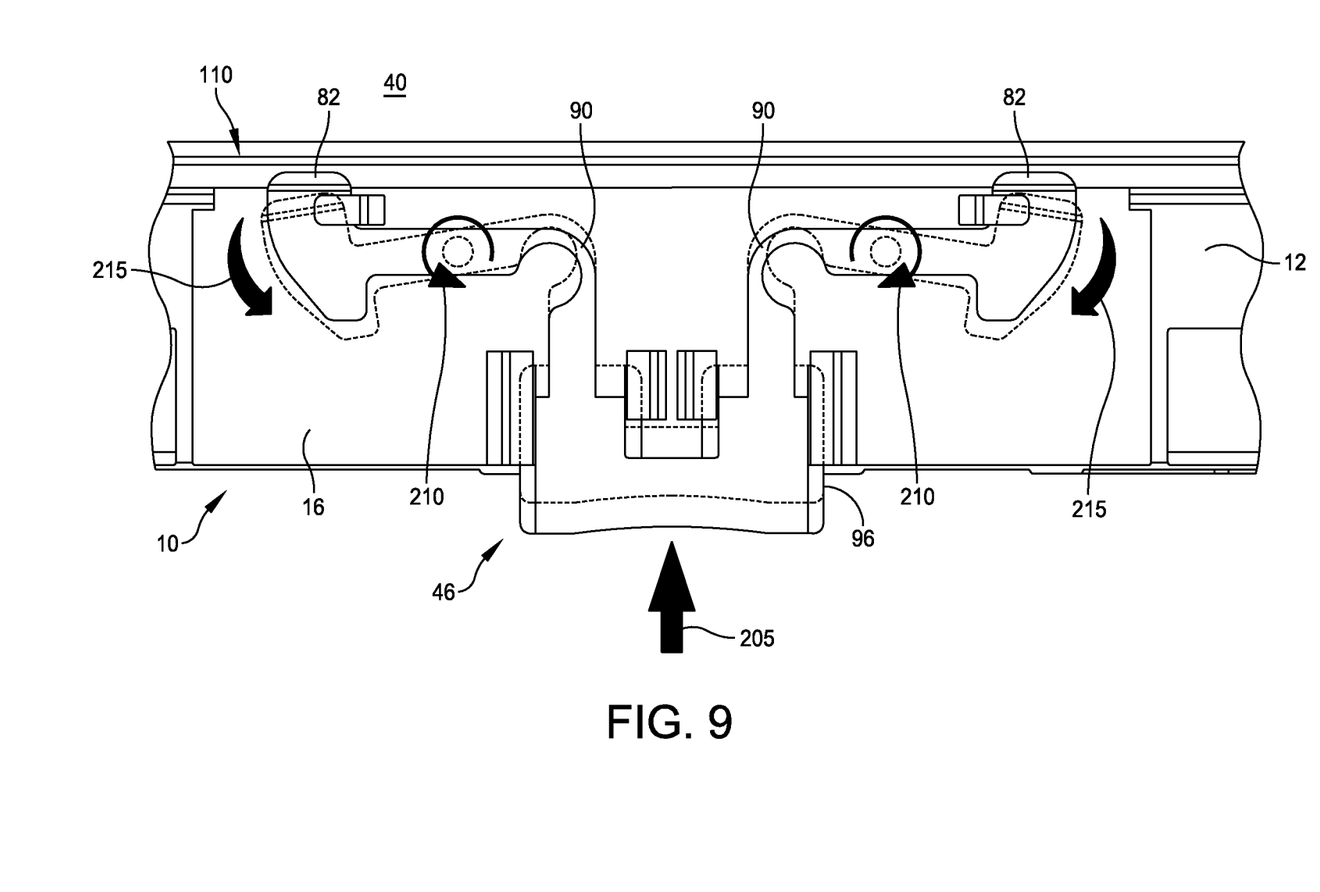
FIG. 9 is a back perspective view of the locking mechanism of the mounting enclosure assembly during operation as indicated by broken lines.

FIG. 9 demonstrates a principle of operation of the locking mechanism 46. The solid lines indicate the locking mechanism 46 in a home position—a position in which the button 96 is not depressed and the protrusions 82 may be engaged to a flange 110 of the DIN rail 40. The dashed lines show the locking mechanism 46 in a release position—a position in which the release button 96 is depressed and the assembly 10 may be removed from the DIN rail 40. Arrow 205 indicates a direction of force applied to the release button 96 to depress the release button 96. The force may be provided by any source. The force may be applied, for example, by an operator's thumb or palm. The components of the locking mechanism 46 are arranged so that the force 205 applied linearly is transformed into a rotational motion 215 that moves the protrusions 82 away from the DIN rail 40. The hinge 90 is configured to compress when force is applied. When the hinge 90 compresses, the first portion of the hinged armature rotates around a pivot point as shown by arrow 210. The pivoting 210 of the first portion causes rotation 215 of the protrusion 82 away from the DIN rail flange 110.

Figure 10:
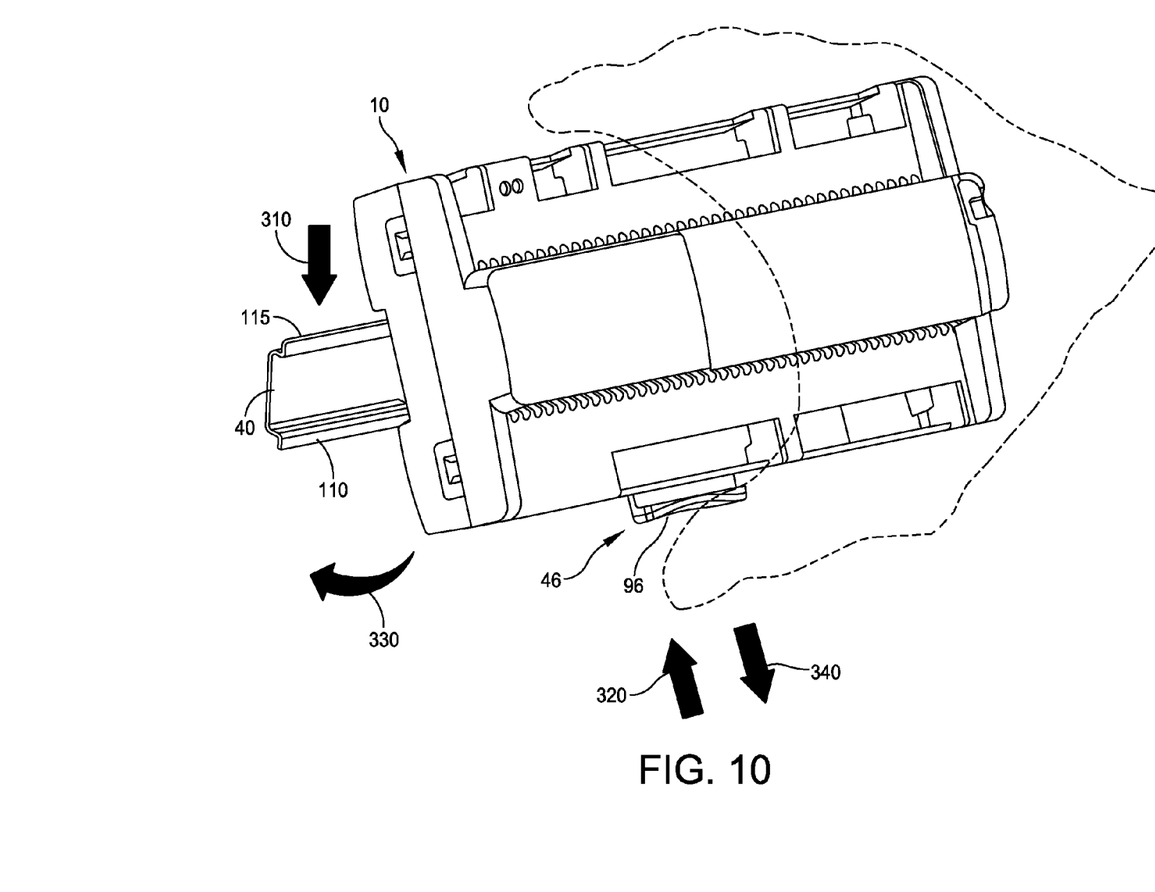
FIG. 10 demonstrates a method of securing the mounting enclosure assembly to the DIN rail.
Figure 11:
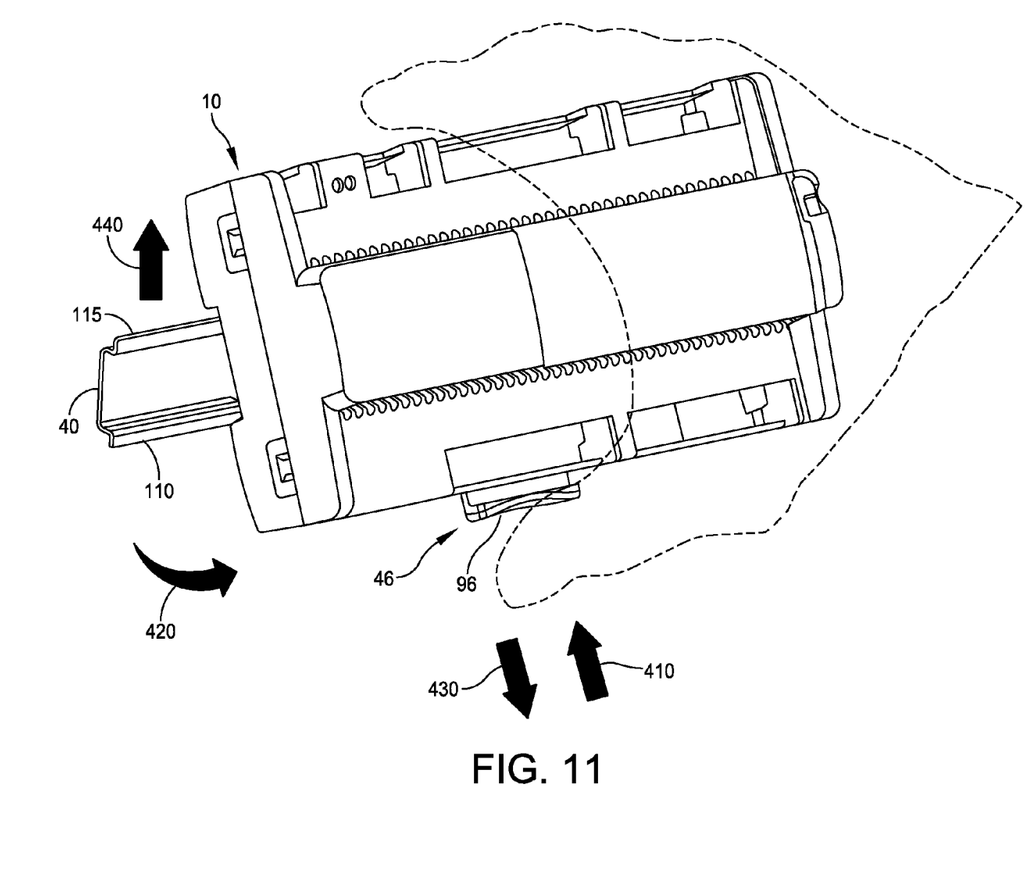
FIG. 11 demonstrates a method of releasing the mounting enclosure assembly from the DIN rail.

FIG. 10 demonstrates a method of securing the assembly 10 to the DIN rail 40. Arrow 310 shows the assembly being moved in a direction to secure one-half of the assembly 10 to the flange 115 of the DIN rail 40. The base of the assembly may include at least one extending protrusion (not shown) that engages or overlaps the flange 115 of the DIN rail 40. Arrow 320, a user depressing the release button 96 of the assembly 10 to retract at least one protrusion (not shown), thus making it possible to twist, as shown by arrow 330, the second half of the assembly 10 onto the other flange 110 of the DIN rail 40. Once the assembly 10 has been lowered so that the at least one protrusion of the locking mechanism 46 is below the flange 110, the button 96 may be released, as indicated by arrow 340. In this manner, for example, the assembly 10 may be secured to the DIN rail 40. Alternatively, the movements indicated by arrows 320 and 340 may be eliminated, as the device 10 may be successfully secured even without an operator providing the movement shown by the arrow 320 of depressing the button 96 of the locking mechanism 46. For example, in embodiments in which the protrusions of the locking mechanism 46 are beveled, depressing the button 96 to secure the assembly 10 to the DIN rail 40 may be unnecessary. As shown in FIGS. 10 and 11, in embodiments of the method where the operator does depress the locking mechanism's button 96, the shape and arrangement of the assembly 10 may be configured to allow the operator to grip the assembly 10 with their hand and depress the button 96 with their thumb.

FIG. 11 demonstrates a method of releasing the assembly 10 from the DIN rail 40. Disengaging the assembly 10 from the DIN rail 40 may be accomplished by, for example, essentially reversing the steps described in relation to FIG. 11. In a first step, indicated by arrow 410, after perhaps gripping the mounting enclosure assembly 10 with a hand, an operator depresses the release button 96 of the locking mechanism 46. This depression may be accomplished by, for example, manipulating the release button 96 with a thumb of the single hand gripping the mounting enclosure assembly 10. After depressing the release button 96 and thereby retracting one or more protrusions extending from the locking mechanism 46, the user may lift or twist that half of the device 10 off its DIN rail flange 110, as indicated by arrow 420. At any point after the retracted protrusions clear the flange 110, the operator may release the button 96 in step 430. Before or after releasing the button 96 shown by the arrow 430, the operator may slide the other half of the assembly 10 off of the other flange 115 of the DIN rail 40, in the direction shown by the arrow 440. In this manner the assembly 10 may be removed from the DIN rail 40.

It is to be appreciated that embodiments of the devices and methods discussed herein are not limited in application to the details of construction and the arrangement of components set forth in the following description or illustrated in the accompanying drawings. The devices and methods are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A mounting enclosure assembly configured to mount an electronic component onto a DIN rail, the mounting enclosure assembly comprising:
   a mounting bracket including a body having a slot configured to receive the DIN rail therein; and
   a locking mechanism connected to the body of the mounting bracket, the locking mechanism being configured to selectively engage the mounting enclosure assembly to the DIN rail, the locking mechanism including
   a release button,
   a first protrusion positioned proximate the slot and configured to releasably engage a first flange of the DIN rail,
   a second protrusion spaced apart from the first protrusion, the second protrusion being positioned proximate the slot and configured to selectively engage the first flange of the DIN rail,
   a first hinged armature connected to the release button and the first protrusion, and
   a second hinged armature connected to the release button and the second protrusion,
   wherein the first protrusion is configured to disengage the first flange of the DIN rail when the release button is depressed, and
   wherein the second protrusion is configured to disengage the first flange of the DIN rail when the release button is depressed.

2. The mounting enclosure assembly of claim 1, wherein the locking mechanism is substantially symmetrical about a plane extending through a center of the release button.

3. The mounting enclosure assembly of claim 1, wherein the first protrusion has a first beveled edge and the second protrusion has a second beveled edge.

4. The mounting enclosure assembly of claim 1, wherein the body of the mounting bracket further includes a third protrusion configured to selectively engage a second flange of the DIN rail, the third protrusion being positioned proximate the slot of the body of the mounting bracket.

5. The mounting enclosure assembly of claim 4, wherein the body of the mounting bracket further includes a fourth protrusion configured to releasably engage the second flange of the DIN rail, the fourth protrusion being spaced apart from the third protrusion, the fourth protrusion positioned proximate the slot of the body of the mounting bracket.

6. The mounting enclosure assembly of claim 1, wherein the first hinged armature includes a first portion positioned proximate the first protrusion, a second portion positioned proximate the release button, and a hinge positioned between the first portion and the second portion.

7. The mounting enclosure assembly of claim 6, wherein the first portion of the first hinged armature includes a boss, and the body of the mounting bracket further comprises a recess to receive the boss.

8. The mounting enclosure assembly of claim 7, wherein the first portion of the first hinged armature is configured to pivot around the boss when the release button is depressed.

9. The mounting enclosure assembly of claim 6, wherein the hinge is integral to the first and second portions of the first hinged armature.

10. The mounting enclosure assembly of claim 9, wherein the hinge is formed by a first tapered end of the first portion of the first hinged armature and a second tapered end of the second portion of the first hinged armature.

11. The mounting enclosure assembly of claim 6, wherein the first portion of the first hinged armature is positioned at an angle to the second portion of the first hinged armature.

12. The mounting enclosure assembly of claim 6, wherein the first portion of the first hinged armature is positioned substantially perpendicular to the second portion of the first hinged armature.

13. The mounting enclosure assembly of claim 6, wherein the first portion of the first hinged armature extends in a direction that is substantially parallel to a direction of the slot, when the mounting enclosure assembly is engaged to the DIN rail.

14. The mounting enclosure assembly of claim 1, wherein the locking mechanism further includes an opening configured and positioned to receive a first fastener therein so that when the fastener is positioned in the opening, the release button cannot be depressed.

15. The mounting enclosure assembly of claim 14, wherein the body of the mounting bracket further includes at least one eyelet configured to receive a second fastener.

16. A method of securing and releasing a mounting enclosure assembly to and from a DIN rail, the method comprising:
  providing the mounting enclosure assembly including a locking mechanism having a release button, a first protrusion configured to selectively engage a first flange of the DIN rail, and a first hinged armature connected to the release button and the first protrusion;
  securing the mounting enclosure assembly to the DIN rail;
  gripping the mounting enclosure assembly;
  depressing the release button;
  lifting the mounting enclosure assembly off of a first flange of the DIN rail while the release button is engaged; and
  lifting the mounting enclosure assembly off of a second flange of the DIN rail,
  wherein the locking mechanism further includes a second protrusion configured to releasably engage a first flange of the DIN rail, and a second hinged armature connected to the release button and the second protrusion.

17. The method of claim 16, wherein gripping the mounting enclosure assembly includes gripping the mounting enclosure assembly with only a single hand.

18. The method of claim 17, wherein depressing the release button includes manipulating the release button with a thumb of the single hand while gripping the mounting enclosure assembly.

\* \* \* \* \*